(12) United States Patent
Eto et al.

(10) Patent No.: US 6,774,478 B2
(45) Date of Patent: Aug. 10, 2004

(54) STACKED SEMICONDUCTOR PACKAGE

(75) Inventors: Junya Eto, Kanagawa-ken (JP);
Kiyotaka Hayashi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/331,865

(22) Filed: Dec. 30, 2002

(65) Prior Publication Data

US 2003/0127736 A1 Jul. 10, 2003

(30) Foreign Application Priority Data

Jan. 4, 2002 (JP) ..................................... P2002-000069

(51) Int. Cl.⁷ .......................... H01L 23/02; H01L 23/22; H01L 23/04
(52) U.S. Cl. ........................ 257/686; 257/687; 257/698; 257/700; 257/707
(58) Field of Search .......................... 257/675, 685–687, 257/698–700, 706, 707, 717, 720; 438/123, 109, 122, 125

(56) References Cited

U.S. PATENT DOCUMENTS

| | | | |
|---|---|---|---|
| 5,579,207 A | * | 11/1996 | Hayden et al. ............. 361/790 |
| 6,493,229 B2 | * | 12/2002 | Akram et al. ............... 361/704 |
| 6,525,942 B2 | * | 2/2003 | Huang et al. ............... 361/704 |

FOREIGN PATENT DOCUMENTS

| | | |
|---|---|---|
| JP | 09-219490 | 8/1997 |
| JP | 09-237853 | 9/1997 |
| JP | 09-326450 | 12/1997 |
| JP | 10-135267 | 5/1998 |
| JP | 10-163414 | 6/1998 |
| JP | 11-163229 | 6/1999 |
| JP | 11-239033 | 8/1999 |

* cited by examiner

*Primary Examiner*—Hung Vu
(74) *Attorney, Agent, or Firm*—Hogan & Hartson, LLP

(57) ABSTRACT

A semiconductor package includes a first insulating substrate, a second insulating substrate, and a plurality of semiconductor chip units placed between the first and second insulating substrates. The first insulating substrate has wiring placed on one surface thereof and has first electrically conductive balls which are used as external connection terminals and second electrically conductive balls which radiate heat. The first and second electrically conductive balls are on the other surface thereof. The second insulating substrate is placed opposite to the one surface of the first insulating substrate. Each semiconductor chip unit has a semiconductor chip; a circuit board which has the semiconductor chip mounted thereon and wiring electrically connected to terminals of the semiconductor chip; and a third insulating substrate which is placed on the circuit board and which has a chip cavity for housing the semiconductor chip. By use of the second electrically conductive balls placed on the first insulating substrate, heat generated in the semiconductor chip is efficiently released outside, thus preventing an increase in temperature of the semiconductor chip.

21 Claims, 6 Drawing Sheets

STACKED SEMICONDUCTOR PACKAGE

CROSS REFERENCE TO RELATED APPLICATION

This application is based upon and claims the benefit of priority from the prior Japanese Patent Application No. 2002-000069 filed on Jan. 4, 2002, the entire contents of which are incorporated herein by reference.

BACKGROUND OF THE INVENTION

1. Field of the Invention

The present invention relates to a heat radiation structure of a semiconductor package having a structure in which a plurality of semiconductor chips are stacked.

2. Description of the Related Art

Semiconductor apparatuses have come to be used in a state where semiconductor chips are stacked in order to increase packaging densities, in many cases. Conventional stacked packages are described in Japanese Patent Publications H9-219490 (published in 1997), H10-135267 (published in 1998), and H10-163414 (published in 1998). In these conventional packages, packages, such as thin small outline packages (TSOPs), tape carrier packages (TCPs), or ball grid arrays (BGAs), are assembled completely, and then the packages, which each have external terminals provided on the packages in advance individually stacked upon one another, are stacked. Furthermore, the packages are electrically connected.

Meanwhile, as described in Japanese Patent Publication H11-239033 (published in 1999), a stacked semiconductor package which is thin, excellent in sealing performance and elasticity, and capable of being easily formed by a relatively simple manufacturing process, has also been proposed. The semiconductor package is called a system block module (abbreviated as an SMB), and is formed by stacking a plurality of paper thin packages (PTPs) employing thin silicon substrates.

A conventional SMB-type semiconductor package has a stacked structure made by stacking a plurality of units. Each unit includes a semiconductor chip, a circuit board having the semiconductor chip mounted thereon, and a frame-shaped insulating substrate which has a chip cavity and which is mounted on the circuit board. The stacked structure in which the plurality of units are stacked is sandwiched by two insulating substrates, and then the resultant structure is made monolithic, thus forming the SMB-type semiconductor package. A required number of external connection terminals made of solder balls or the like are formed on an outer surface of one insulating substrate. The external terminals are electrically connected to electrodes of the semiconductor chips, respectively, through electrically conductive vias formed in the insulating substrates.

Adoption of such a stacked semiconductor package realizes a smaller semiconductor apparatus with higher density. However, since a smaller semiconductor apparatus has a structure with such high density integration of semiconductor chips, heat is more apt to be generated.

A high temperature of a semiconductor chip harmfully affects operations and reliability of the semiconductor device. Particularly in a semiconductor memory such as a dynamic random access read write memory (DRAM), a high temperature causes deterioration in memory retention characteristics. Accordingly, in stacked semiconductor packages, heat radiation measures are required.

SUMMARY OF THE INVENTION

A semiconductor package of an aspect of the present invention includes (1) a first insulating substrate, which has wiring placed on one surface thereof and which has a plurality of first electrically conductive balls that are used as external connection terminals and a plurality of second electrically conductive balls that radiate heat, the first and second electrically conductive balls are placed on the other surface thereof; (2) a second insulating substrate placed opposite to the one surface of the first insulating substrate; and (3) a plurality of semiconductor chip units placed between the first and second insulating substrates. Each semiconductor chip unit has a semiconductor chip; a circuit board on which the semiconductor chip is mounted and which is provided with wiring electrically connected to terminals of the semiconductor chip; and a third insulating substrate which is placed on the circuit board and which has a chip cavity for housing the semiconductor chip.

A semiconductor apparatus of an aspect of the present invention includes the semiconductor package of the above-described aspect; and a mount board on which the semiconductor package is mounted and which has a plurality of wiring layers and heat conducting paths for connecting any one of the plurality of wiring layers to the second electrically conductive balls of the semiconductor package. Here, the heat conducting paths are formed in the mount board.

DETAILED DESCRIPTION OF THE EMBODIMENTS

First Embodiment

Figure 1A:
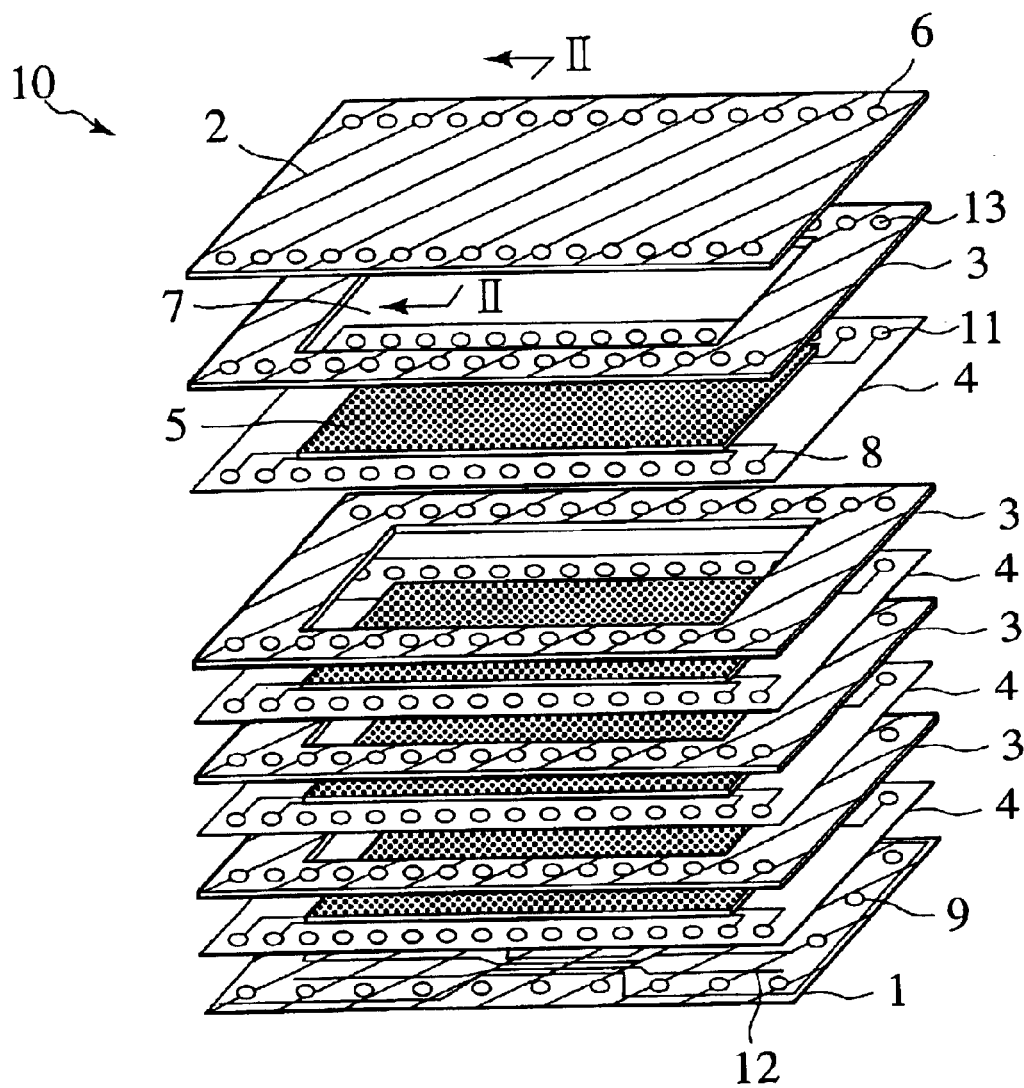
FIG. 1A is a perspective view showing a structure of an SBM-type semiconductor package according to a first embodiment of the present invention.

FIG. 1A shows a structure of an SBM-type semiconductor package according to a first embodiment.

The semiconductor package 10 according to the first embodiment includes circuit boards 4 each having a semiconductor chip 5 mounted thereon, a first insulating substrate 1 which has external connection terminal balls 14 (first electrically conductive balls) which is placed at the bottom of the package, a second insulating substrate 2 which seals the package and which is placed at the top of the package, and third insulating substrates 3 each having a chip cavity 7 for housing the semiconductor chip 5. Specifically, as shown in FIG. 1A and FIGS. 2A to 2C, in the semiconductor package 10, a plurality of semiconductor chip units 10a, each having a structure in which the frame-shaped third insulating substrate 3 having the chip cavity 7 is mounted on the circuit board 4 having the semiconductor chip 5 mounted thereon, are stacked. The stack is sandwiched by the first and second insulating substrates 1 and 2, and then the resultant structure is heated and pressed to be made monolithic, thus forming the semiconductor package 10.

Figure 1B:
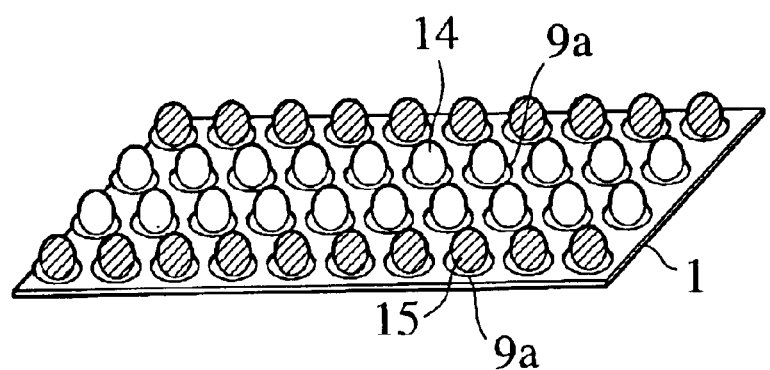
FIG. 1B is a perspective view showing a backside structure of a first insulating substrate 1 of the semiconductor package shown in FIG. 1A.

Moreover, as shown in FIG. 1B, the semiconductor package 10 according to the first embodiment has heat radiation electrically conductive balls 15 (second electrically conductive balls) on a back surface of the first insulating substrate 1, additionally to the external connection terminal balls 14. Furthermore, in order to accelerate heat radiation performance, heat conducting paths connected to the heat radiation electrically conductive balls 15 is formed within the semiconductor package 10. The structure of the semiconductor package 10 will be described more specifically below.

Figure 2A:
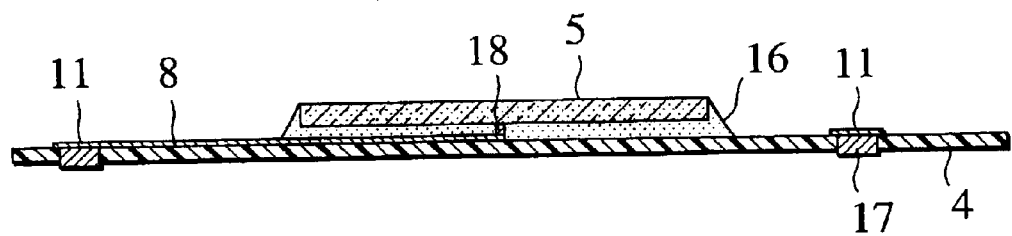
FIG. 2A is a cross-sectional view showing structures of a circuit board 4 and a semiconductor chip 5 mounted thereon of the semiconductor package according to the first embodiment of the present invention.

As shown in FIG. 2A, for the circuit board 4 on which the semiconductor chip 5 is to be mounted, an insulating substrate such as a glass epoxy tape with copper foil having a thickness of about 40 $\mu$m is used. Connection-electrodes 17 are buried in via holes of the circuit board 4. The copper foil on the circuit board 4 is patterned into a shape including lands 11, which are electrode portions on the connection-electrodes, and wiring 8, which is formed in regions other than the lands and which is electrically connected to the semiconductor chip 5. A thickness of the semiconductor chip 5 is about 10 to 200 $\mu$m, preferably about 30 to 90 $\mu$m.

The semiconductor chip 5 is placed on a main surface of the circuit board 4, and bump electrodes 18, which are exposed on a surface of the semiconductor chip 5 and which are terminals electrically connected to an internal circuit, are connected to the wiring 8. Moreover, the wiring 8 is connected to the lands 11 which are formed on the connection-electrodes 17 buried in the circuit board 4. A space between the main surface and the semiconductor chip 5 is sealed with a resin sealant 16 of underfill resin made of epoxy resin or the like.

Figure 2B:
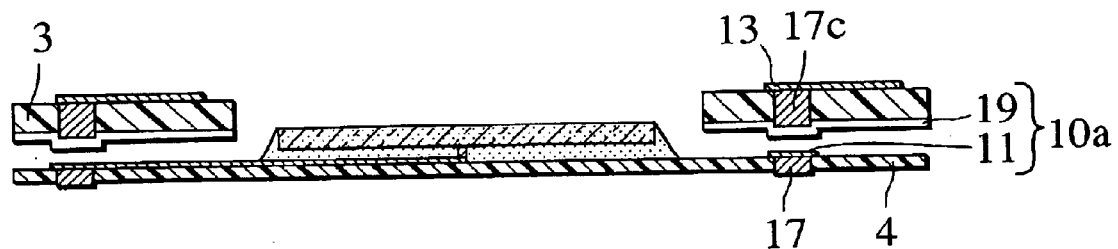
FIG. 2B is a cross-sectional view showing a combination of the circuit board 4 and a third insulating substrate 3.

As shown in FIG. 2B, the third insulating substrate 3 is bonded with an adhesive layer 19 to the circuit board on which the semiconductor chip 5 is mounted.

The first insulating substrate 1, placed at the bottom layer of the semiconductor package 10, is made of a glass epoxy tape or the like and has wiring 12 and lands 9. On the back surface of the first insulating substrate 1, the plurality of external connection terminal balls 14 are formed in a predetermined region. The external connection terminal balls 14 are electrically conductive balls made of solder or the like, for example. The heat radiation electrically conductive balls 15 are provided to a region on the back surface other than the predetermined region, that is, a region where external connection terminal balls are not formed in a conventional semiconductor apparatus. Material and sizes of the heat radiation electrically conductive balls 15 may be the same as those of the external connection terminal balls 14. Of course, the sizes may be changed. Alternatively, in order to improve heat radiation characteristics, only for the heat radiation electrically conductive balls 15, material which has higher heat radiation performance than those of the external connection terminal balls 14, can be selected. Via holes are formed in the first insulating substrate 1, and connection-electrodes 17a are buried in the via holes. When the circuit board 4 is laminated on the first insulating substrate 1, the connection-electrodes 17a buried in the via holes of the first insulating substrate 1 are electrically connected to the connection-electrodes 17 which are formed directly above the connection-electrodes 17a with the lands 9 therebetween and which are in the via holes located in the circuit board 4.

In the second insulating substrate 2 located at the uppermost layer of the semiconductor package 10, connection-electrodes 17b are buried in via holes. On the connection-electrodes 17b, lands 6 are formed. When the circuit board 4 is stacked on the third insulating substrate 3, connection-electrodes 17c buried in via holes of the third insulating substrate 3 are electrically connected to the connection-electrodes 17 which are formed directly above the connection-electrodes 17c with lands 13 therebetween and which are in the via holes located in the circuit board 4. The same applies to the case where the third insulating substrate 3 is laminated on the circuit board 4.

As the third insulating substrate 3, an insulating substrate, such as a polyimide substrate with copper foil having a thickness of about 75 $\mu$m or a printed multilayer substrate, is used. The third insulating substrate 3 has the connection-electrodes 17c buried in the via holes thereof. The copper foil on the third insulating substrate 3 is patterned into a shape including the lands 13 on the connection-electrodes 17c and wirings. As shown in FIG. 2B, an adhesive layer 19 is formed on a back surface of the third insulating substrate 3. An opening portion (chip cavity) 7 for housing the semiconductor chip 5 is formed in a central portion of the third insulating substrate 3. A thickness of the third insulating substrate 3 may be either equal to or thinner than a thickness of the circuit board 4 as long as the semiconductor chip 5 can be housed in the chip cavity 7. Since adhesive is applied to the third insulating substrate 3, the adhesive plugs in the chip cavity 7 when integration process is performed. When the second insulating substrate 2 is laminated on the third insulating substrate 3, the connection-electrodes 17b buried in the via holes of the second insulating substrate 2 are electrically connected to the connection-electrodes 17c which are formed directly below the connection-electrodes 17b with the lands 13 therebetween and which are buried in the via holes of the third insulating substrate 3.

Figure 2C:
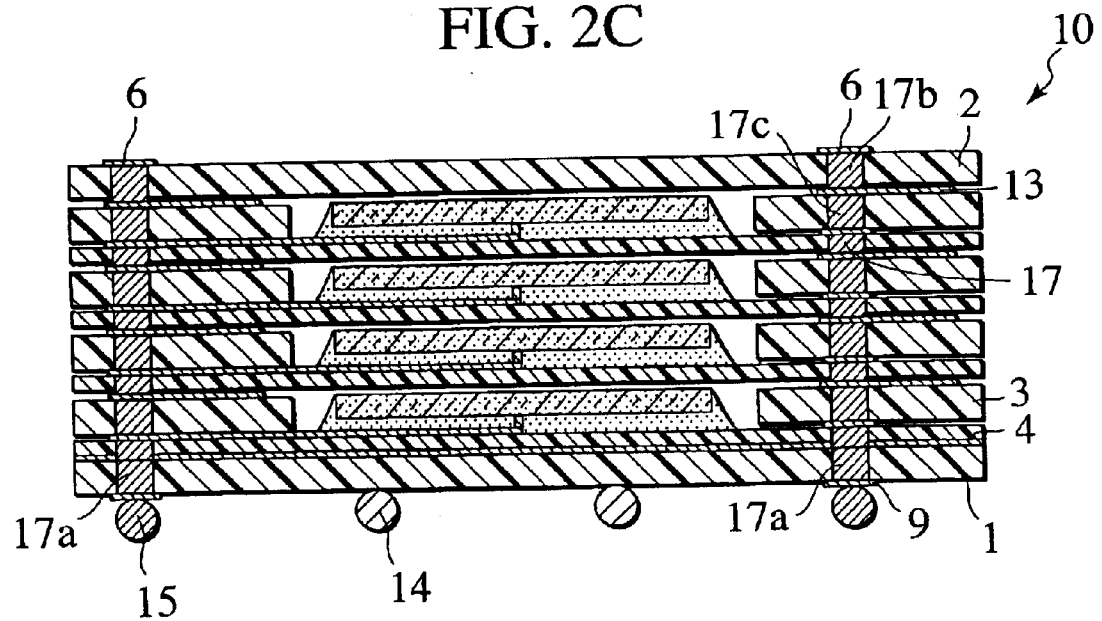
FIG. 2C is a cross-sectional view of the semiconductor package according to the first embodiment.

As shown in FIG. 2C, the connection-electrodes 17 and 17a to 17c are made of, for example, copper and collectively form continuous electrically conductive paths, which penetrate the semiconductor package 10 in a vertical direction, to be connected to the heat radiation electrically conductive balls 15. Therefore, the electrically conductive paths are electrically connected to the wiring 8 of the circuit boards 4, and can be used as buses for signal lines or power supply lines. The electrically conductive paths can also be utilized as heat radiation paths for radiating heat accumulated in the semiconductor package 10. The heat radiation paths are formed so as to be connected to the heat radiation electrically conductive balls 15 formed at predetermined positions in peripheral portions of the stack.

Accordingly, in a semiconductor package 10 according to the first embodiment, heat generated in stacked semiconductor devices is immediately conducted to heat radiation electrically conductive balls 15 through heat conducting paths constituting connection-electrodes which are formed in insulating substrates and circuit boards, whereby the heat is efficiently radiated.

A semiconductor package 10 according to the first embodiment has a stack in which a plurality of thin semiconductor chips are stacked, and the stack is sandwiched by insulating substrates from above and below the stack, thus having enhanced sealing performance for semiconductor chips. Incidentally, a semiconductor chip 5 is housed in a chip cavity 7 formed on a third insulating substrate 3. Since thickness and area of the chip cavity 7 is larger than those of the semiconductor chip 5, a space is formed between the semiconductor chip 5 and inner walls of the chip cavity 7 when the semiconductor chip 5 is housed in the chip cavity 7. Therefore, even when an external force is applied to the semiconductor apparatus, generated stresses can be absorbed.

Figure 3:
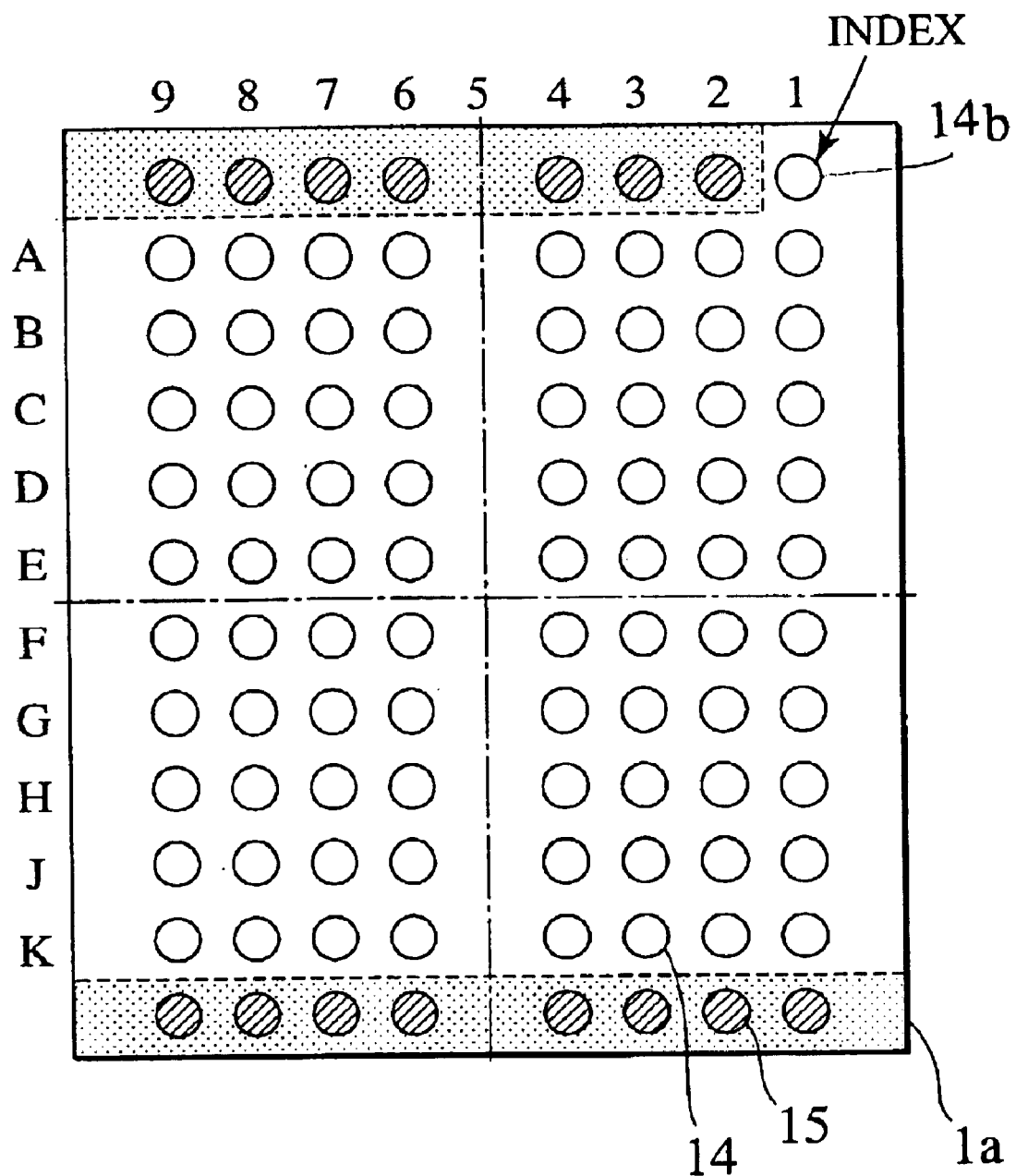
FIG. 3 is a plan view showing a layout example of external connection terminal balls 14 and heat radiation electrically conductive balls 15 on a back surface of the first insulating substrate 1 in the semiconductor package according to the first embodiment.

FIG. 3 is a plan view showing another layout example of the external connection terminal balls 14 and the heat radiation electrically conductive balls 15, which are formed on the back surface of the first insulating substrate 1.

The external connection terminal balls 14 are laid out in the form of an array on the back surface of the first insulating substrate 1. In the first insulating substrate 1 shown in FIG. 3, for example, the external connection terminal balls 14 are laid out in a region from Column 1 to Column 9 except for Column 5 in a column direction, in a region of ten rows from Row A to Row K in a row direction. At a given corner, for example, at a position of Column 1 Row A in this example, an electrically conductive ball 14A, which is made of the same material as that of the external connection terminal balls, is placed as an index indicating a layout direction.

The back surface of the first insulating substrate 1 generally has a marginal region on the periphery of a layout region of the external connection terminal balls 14. In the first insulating substrate according to the first embodiment, the marginal region is utilized as a layout region of the heat radiation electrically conductive balls 15. In FIG. 3, for example, seven pieces of the heat radiation electrically conductive balls 15 are laid out along a row of the external connection terminal balls 14 in Row A. In addition, eight pieces of the heat radiation electrically conductive balls 15 are laid out along a row of the external connection terminal balls 14 in Row K.

Since the heat radiation electrically conductive balls 15 are laid out where the external connection terminal balls 14 are not formed, positions of the external connection terminal balls 14 do not need to be newly designed again. The first insulating substrate 1 has a length of 12.5 mm and a width of 11.00 mm, for example. The external connection terminal balls 14 has a diameter of 0.5 mm and are laid out in the form of a grid at a pitch of 1.00 mm in both vertical and horizontal directions, for example. Two rows of the heat radiation electrically conductive balls 15 are laid out on both sides of the layout region of the external connection terminal balls 14.

The numbers of the external connection terminal balls 14 and the heat radiation electrically conductive balls 15, which are to be laid out, vary depending on the number of the semiconductor chips to be stacked and on types or the like of devices formed on the semiconductor chips, and are not limited. Moreover, two more rows of the heat radiation electrically conductive balls 15 may be laid out on left and right sides of the layout region of the external connection terminal balls 14 in FIG. 3 if necessary, in addition to the two rows shown in the drawing.

A temperature of a semiconductor package containing a semiconductor chip increases due to heat generated in a semiconductor device when the semiconductor package is used. The package temperature varies depending on the number of the external connection terminal balls attached to the package.

Figure 4:
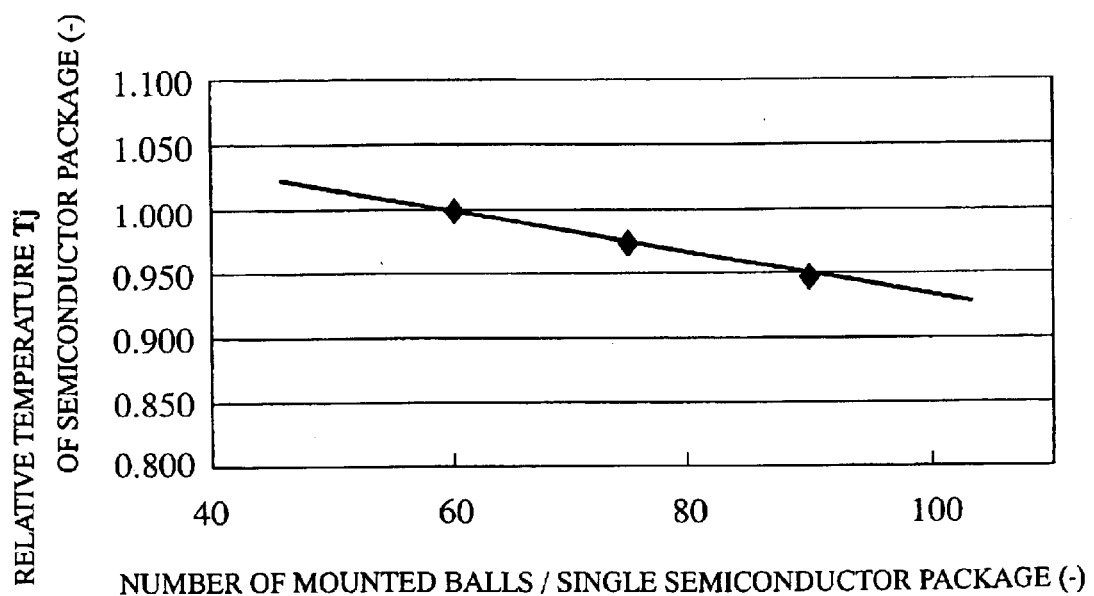
FIG. 4 is a graph showing the relationship between the number of electrically conductive balls formed on a back surface of a first insulating substrate of a semiconductor package and an operation temperature of the semiconductor package.

FIG. 4 is a graph showing the relationship between a relative temperature of a semiconductor package in operation and the number of external connection terminal balls (hereinafter simply referred to as balls). The vertical axis indicates relative temperature Tj of semiconductor packages, and the horizontal axis indicates the number of mounted balls per single package. In the graph, the package temperatures are shown relatively, where a temperature of a semiconductor package having 60 balls, which is an average number of balls included in a conventional type first insulating substrate used, is assumed to be 1 as a reference value.

As shown in FIG. 4, if the number of balls in a semiconductor package is smaller than 60, the temperature is higher than 1. If the number of balls in a semiconductor package is larger than 60, the temperature is lower than 1. Thus, it can be seen that the temperature increases or decreases depending on the number of the balls mounted on the package. Therefore, the package temperature can be efficiently adjusted by mounting the above-described heat radiation electrically conductive balls 15 on the first insulating substrate 1 properly.

As described above, according to a semiconductor package of the first embodiment, heat generated in semiconductor devices can be efficiently released to a first insulating substrate 1, thus preventing an increase in temperature of a semiconductor apparatus itself. In the case where the semiconductor devices include a DRAM, for example, the increase in temperature has led to deterioration in memory retention characteristics, but a semiconductor package of the first embodiment makes it possible to prevent deterioration in characteristics of the semiconductor devices.

Second Embodiment

Figure 5:
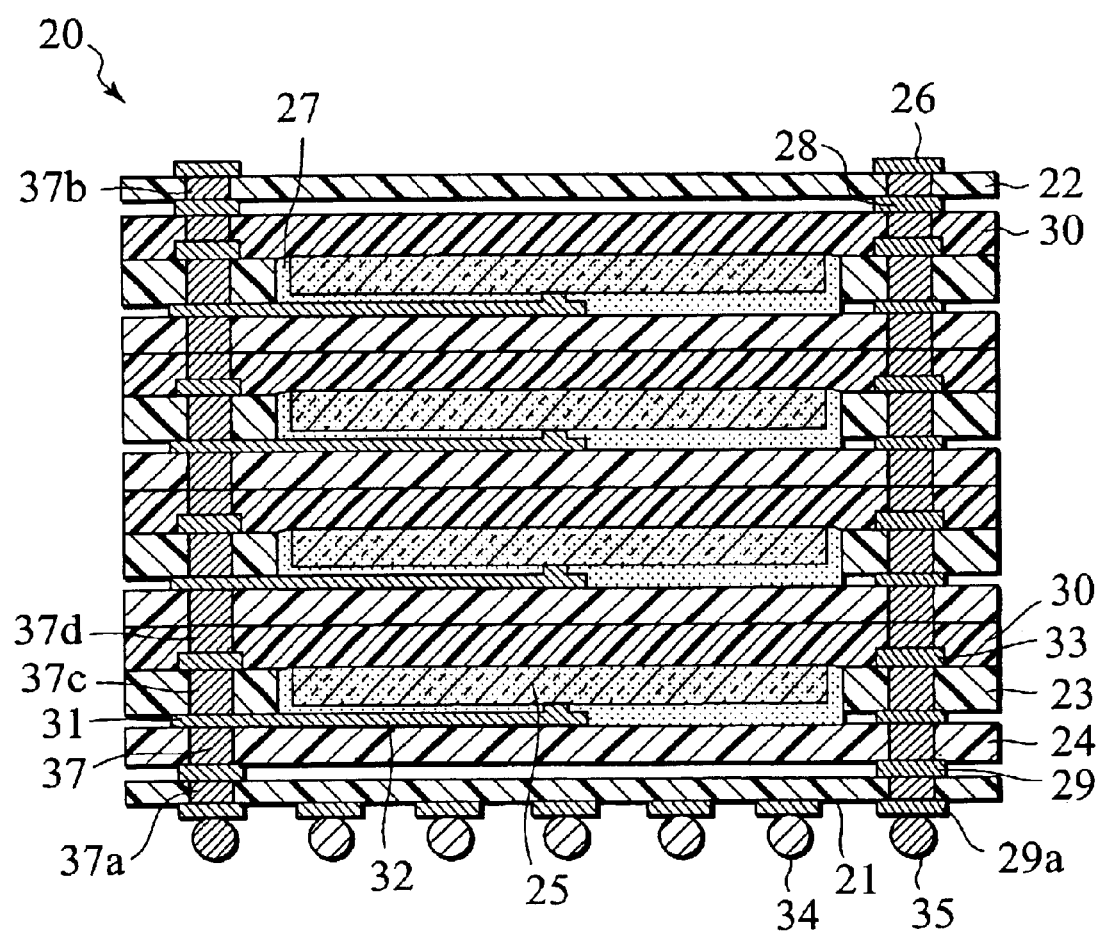
FIG. 5 is a cross-sectional view of a semiconductor package according to a second embodiment.

FIG. 5 is a cross-sectional view of an SBM-type stacked semiconductor package according to a second embodiment. In the second embodiment, although four semiconductor (such as silicon) devices (chips) are stacked, the number of semiconductor chips to be stacked is not limited. A required number, of two or more, semiconductor chips are stacked.

In the semiconductor package 20 according to the second embodiment, a plurality of units, each having a structure in which a frame-shaped third insulating substrate 23 having a chip cavity 7 is mounted on a circuit board 24 having a semiconductor chip 25 mounted thereon and in which a heat conductive resin layer 30 covers the semiconductor chip 25, are stacked. The stack is sandwiched by first and second insulating substrates 21 and 22, and then the resultant structure is heated and pressed to be made monolithic, thus forming the semiconductor package 20.

Similarly to the semiconductor package 10 according to the first embodiment, the semiconductor package 20 according to the second embodiment has heat radiation electrically conductive balls 35 on a back surface of the first insulating substrate 21, and heat radiation paths, which penetrate the semiconductor package 20 and which are connected to the heat radiation electrically conductive balls 35, are formed. Furthermore, the insulating heat conductive resin layer 30 is formed on a surface of each semiconductor chip 25 and is connected to the heat radiation paths, thus improving heat radiation efficiency further. Each structure will be described more specifically below.

For the circuit board 24 on which the semiconductor chip 25 is to be mounted, an insulating substrate such as a glass epoxy tape with copper foil having a thickness of about 40 $\mu$m is used. Connection-electrodes 37 are buried in via holes of the circuit board 24. The copper foil on the circuit board 24 is patterned into a shape including lands 31 on the connection-electrodes, and wiring 32 which is formed in regions other than the lands and which is electrically connected to the semiconductor chip 25. A thickness of the semiconductor chip 25 is about 10 to 200 μm, preferably about 30 to 90 μm.

For the heat conductive resin layer 30 covering the semiconductor chip 25, any insulating and heat conducting resin can be used, but a resin layer that is highly conductive to heat is preferably used. Specifically, a polyimide resin layer, a polyimide resin layer containing particles highly conductive to heat, carbon, metal, or the like, or a resin layer having a metal layer inserted therein, where the metal layer is made of highly heat conductive copper (Cu) or silver (Ag), may be used, for example. If resin is used while being combined with highly heat conductive material like the above, the resin itself is not required to have high heat conductivity.

As the heat conductive resin layer 30, a polyimide resin layer having a thickness of about 5 μm can be formed by coating, for example. Although it is preferred that the insulating heat conductive resin layer 30 covers both upper and side surfaces of the semiconductor chip 25, the insulating heat conductive resin layer 30 may cover only part of the surface of the semiconductor chip 25. As shown in FIG. 5, connection-electrodes 37*d* arc buried in via holes of the insulating heat conductive resin layer 30, and lands 28 are formed on the connection-electrodes 37*d*. When the circuit board 24 or the second insulating substrate 22 is laminated on the insulating heat conductive resin layer 30, the connection-electrodes 37*d* buried in the via holes of the heat conductive resin layer 30 are electrically connected to the connection-electrodes 37 or 37*b* which are formed directly above the connection-electrodes 37*d* with the lands 28 therebetween and which are in the via holes located in the circuit board 24 or the second insulating substrate 22.

The first insulating substrate 21, placed at the bottom layer of the semiconductor package 20, is made of a glass epoxy tape or the like and has wiring 32 and lands 29. On the back surface of the first insulating substrate 21, the plurality of external connection terminal balls 34 are formed in a predetermined region with lands 29*a* therebetween. The external connection terminal balls 34 are electrically conductive balls made of solder or the like, for example. The heat radiation electrically conductive balls 35 are provided, with the lands 29*a* therebetween, to a region on the back surface other than the predetermined region, that is, a region where external connection terminal balls are not formed in a conventional semiconductor apparatus. Material and sizes of the heat radiation electrically conductive balls 35 may be the same as those of the external connection terminal balls 34. Of course, the sizes may be changed. Alternatively, in order to improve heat radiation characteristics, only for the heat radiation electrically conductive balls 35, material which has high heat radiation performance can be selected. Via holes are formed in the first insulating substrate 21, and connection-electrodes 37*a* are buried in the via holes. When the circuit board 24 is laminated on the first insulating substrate 21, the connection-electrodes 37*a* buried in the via holes of the first insulating substrate 21 are electrically connected to the connection-electrodes 37 which are formed directly above the connection-electrodes 37*a* with the lands 29 therebetween and which are in the via holes located in the circuit board 24.

The second insulating substrate 22, located at the uppermost layer of the semiconductor package 20, has lands 26 and connection-electrodes 37*b* buried in via holes. The lands 26 are formed on the connection-electrodes 37*b*.

As the third insulating substrate 23, an insulating substrate, such as a polyimide substrate with copper foil having a thickness of about 75 μm or a printed multilayer substrate, is used. The third insulating substrate 23 has the connection-electrodes 37*c* buried in the via holes thereof. The copper foil on the third insulating substrate 23 is patterned into a shape including the lands 33 on the connection-electrodes 37*c* and wiring. A chip cavity 27 for housing the semiconductor device 25 is formed in a central portion of the third insulating substrate 23. A thickness of the third insulating substrate 23 may be either equal to or thinner than a thickness of the circuit board 24 as long as the semiconductor device 25 can be housed in the chip cavity 27. Since adhesive is applied to the third insulating substrate 23, the adhesive plugs in the chip cavity 27 when an integration process is performed. When the insulating heat conductive resin layer 30 is laminated on the third insulating substrate 23, the connection-electrodes 37*c* buried in the via holes of the third insulating substrate 23 are electrically connected to the connection-electrodes 37*d* which are formed directly above the connection-electrodes 37*c* with the lands 33 therebetween and which are buried in the via holes of the heat conductive resin layer 30.

As described above, the connection-electrodes buried in the circuit boards and the insulating substrates which are components of the stack, are connected to the other adjacent connection-electrodes directly above or below themselves. Therefore, in the stack, the connection-electrodes buried in the circuit board and the insulating substrates are electrically connected in a vertical direction (stacking direction), and thus can be used as buses for signal lines or power supply lines.

As shown in FIG. 5, the connection-electrodes 37 and 37*a* to 37*d* collectively form electrically conductive paths, which penetrate the semiconductor package 20 in a vertical direction, to be connected to the heat radiation electrically conductive balls 35. Therefore, the electrically conductive paths can be used as buses for signal lines or power supply lines and can also be utilized as heat radiation paths for radiating heat accumulated in the semiconductor package 20.

An example of semiconductor devices formed in semiconductor chips which are laminated on the circuit boards 24, is a synchronous DRAM (SDRAM) or a first cycle RAM (FCRAM). If semiconductor chips on which SDRAMs are formed are stacked, it is preferred that the semiconductor chips 25 are covered with insulating heat conductive resin layers 30 to improve heat radiation performance as in the semiconductor package 20 of the second embodiment. However, if a logic device, a flash memory, or the like is added as a stacked semiconductor chip to the stack in addition to the SDRAMs, the heat conductive resin layers 30 may cover only the SDRAMs that is generating more heat without covering a logic device or the like that is generating less heat. In order to make a semiconductor apparatus thinner, heat conductive resin is preferably used only for required portions, because heat conductive resin layer becomes an inhibiting factor that can prevent a semiconductor apparatus from being thinner.

Meanwhile, if both SDRAMs and flash memories are contained in one semiconductor apparatus, the flash memories are required to be stacked so that they are kept separate from the SDRAMs, which generate much heat, as long as possible.

If semiconductor chips on which FCRAMs are formed are stacked, the above semiconductor module structures for the SDRAMs are applicable to the FCRAMs.

As described above, in a semiconductor package according to the second embodiment, heat radiation electrically conductive balls 35 as well as external connection terminal balls 34 are provided to a back surface of a first insulating substrate, and furthermore, insulating heat conductive resin layers 30 are inserted so as to cover semiconductor chips 25. Accordingly, heat generated in the semiconductor chips 25 is immediately conducted to the heat radiation electrically conductive balls 35 through heat conducting paths constituting connection-electrodes 37 and 37a to 37d, whereby the heat is more efficiently radiated.

Third Embodiment

Figure 6:
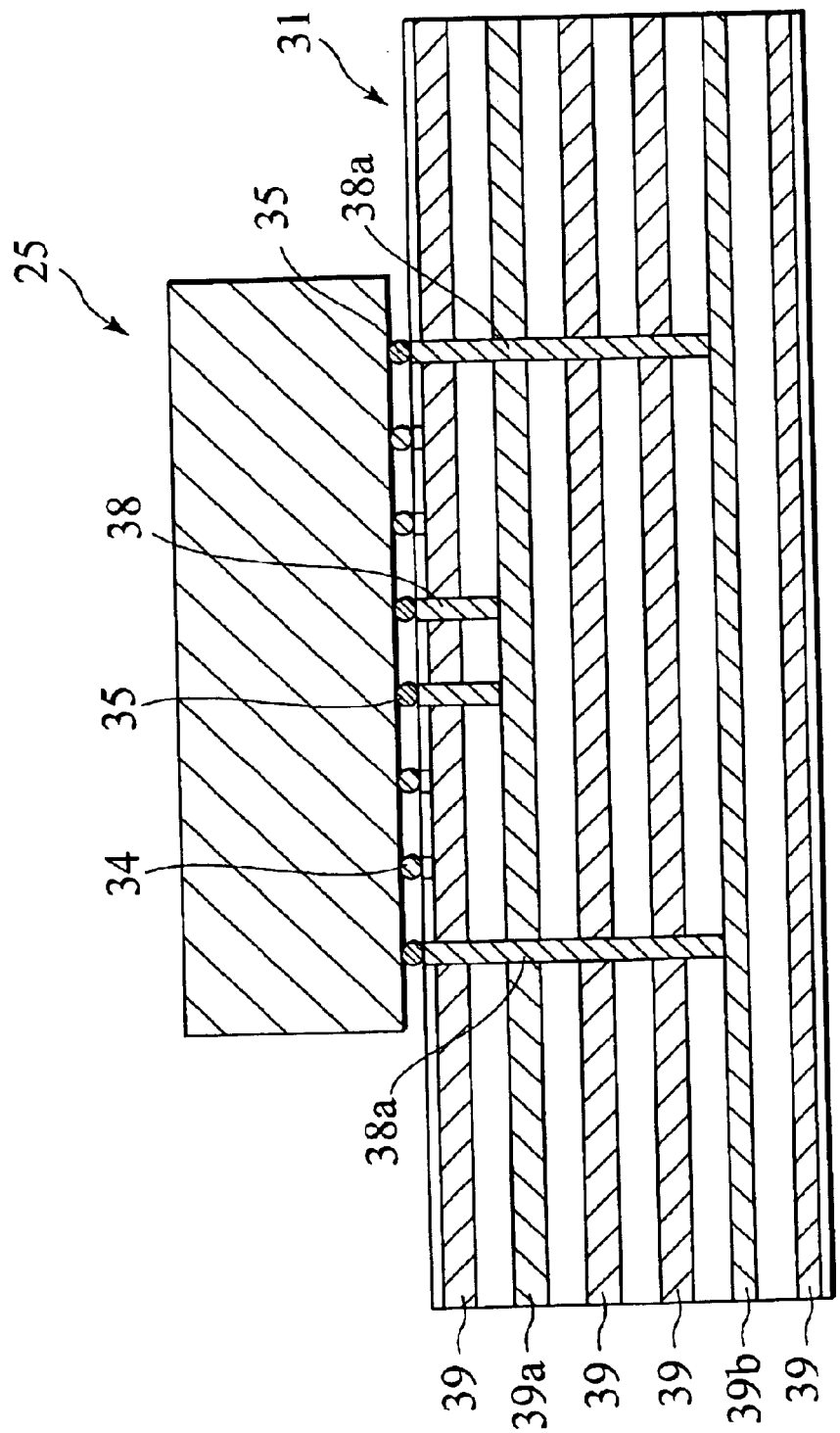
FIG. 6 is a cross-sectional view of a semiconductor apparatus according to a third embodiment.

FIG. 6 is a cross-sectional view of a semiconductor apparatus in which an SBM-type semiconductor package is mounted on a mount board. A semiconductor package 25 having a similar structure to that of the first or second embodiment is mounted on the mount board 31, for example.

As the mount board 31, a circuit board having multilayer wiring of 6 layers impregnated with epoxy resin, is used, for example. Concerning the multilayer wiring buried in the circuit board, signal wiring 39 is located on the uppermost layer, and is followed by power supply wiring 39a, signal wiring 39 and 39, ground wiring 39b, and signal wiring 39, which are located in this order in a multilayered manner. The power supply wiring 39a and the ground wiring 39b are connected to beat conducting paths 38 and 38a made of aluminum or the like, one ends of which are exposed on a surface of the mount board. The heat conducting paths 38 and 38a are exposed on the surface of the mount board 31 and, moreover, are electrically connected to wiring and buried wiring (not shown). Connection wiring extending inside (not shown) and the like are also formed.

A plurality of external connection balls 34 and a plurality of heat radiation electrically conductive balls 35 are attached to a back surface of a first insulating substrate of the semiconductor package 25, that is, a lower surface of the package. In the semiconductor package 25, two rows of the heat radiation electrically conductive balls 35 are laid out also in a central portion of the back surface of the first insulating substrate. Thus, the heat radiation electrically conductive balls 35 can be located also in the central portion as long as the central portion is in a marginal region, where the external connection terminal balls are not located.

The semiconductor package 25 is mounted on the mount board 31. When the package 25 is mounted on the surface of the mount board 31, the external connection terminal balls 34 are appropriately electrically connected to buried wiring, such as the signal wiring 39, power supply wiring 39a, and the ground wiring 39b, through the connection wiring buried in the mount board 31. The heat radiation electrically conductive balls 35 abut against and are heated to be joined to the heat conducting paths 38 and 38a, which are exposed on the surface of the mount board 31. Thus, since the plurality of heat radiation electrically conductive balls 35 are appropriately connected to the power supply wiring 39a or the ground wiring 39b through the heat conducting paths 38 and 38a, heat generated in semiconductor chips which are housed in the semiconductor package 25 is released outside through the mount board 31. Accordingly, the heat can be released more efficiently.

According to the above-described structure, heat generated in semiconductor chips can be efficiently released outside through heat radiation electrically conductive balls, thus preventing an increase in temperature of a semiconductor apparatus itself. In the case where the semiconductor devices include a DRAM, for example, the increase in temperature has led to deterioration in memory retention characteristics, but the above-described structure makes it possible to prevent deterioration in characteristics of the semiconductor devices.

Although the present invention has been described in accordance with the embodiments, the present invention is not limited to descriptions of these embodiments. It will be obvious to those skilled in the art that various changes and modifications may be made.

What is claimed is:

1. A semiconductor package, comprising:
   (1) a first insulating substrate having wiring placed on one surface thereof and having a plurality of first electrically conductive balls which are used as external connection terminals and a plurality of second electrically conductive balls which radiate heat, the first and second electrically conductive balls placed on the other surface thereof;
   (2) a second insulating substrate placed opposite to the one surface of the first insulating substrate; and
   (3) a plurality of semiconductor chip units placed between the first and second insulating substrates, each semiconductor chip unit comprising:
      a semiconductor chip;
      a circuit board on which the semiconductor chip is mounted and which is provided with wiring electrically connected to terminals of the semiconductor chip;
      a third insulating substrate which is placed on the circuit board and which has a chip cavity for housing the semiconductor chip; and
      a heat conductive resin layer which contacts and covers the semiconductor chip.

2. The semiconductor package according to claim 1, wherein
   the first insulating substrate has a plurality of first via holes and a plurality of first connection-electrodes buried in the respective first via holes,
   the second insulating substrate has a plurality of second via holes and a plurality of second connection-electrodes buried in the respective second via holes,
   each third insulating substrate has a plurality of third via holes and a plurality of third connection-electrodes buried in the respective third via holes,
   each circuit board has a plurality of fourth via holes and a plurality of fourth connection-electrodes buried in the respective fourth via holes,
   the first connection-electrode, the second connection-electrode, the third connection-electrodes, and the fourth connection-electrodes are placed almost directly above each second electrically conductive ball and are electrically connected to each other.

3. The semiconductor package according to claim 2, wherein
   the heat conductive resin layer has fifth via holes and fifth connection-electrodes buried in the fifth via holes, and
   each fifth connection-electrode is formed directly above each fourth connection-electrode and is electrically connected thereto.

4. The semiconductor package according to claim 1, wherein
   the fourth connection-electrodes are connected to the wiring which is electrically connected to the terminals of the semiconductor chip.

5. The semiconductor package according to claim 1, wherein
   the second electrically conductive balls are made of terial having a higher heat conductivity than that of the first electrically conductive balls.

6. The semiconductor package according to claim 1, wherein
material and a shape of the second electrically conductive balls are the same as those of the first electrically conductive balls.

7. The semiconductor package according to claim 1, wherein
the second electrically conductive balls are solder balls.

8. The semiconductor package according to claim 1, wherein
the second electrically conductive balls are formed a marginal region other than a region where the first electrically conductive balls are to be laid out, on the other surface of the first insulating substrate.

9. The semiconductor package according to claim 1, wherein
the second electrically conductive balls are arranged in the shape of a column on a periphery of a region where the first electrically conductive balls are to be laid out, on the other surface of the first insulating substrate.

10. The semiconductor package according to claim 1, wherein
the heat conductive resin layer contains a polyimide resin layer.

11. The semiconductor package according to claim 1, wherein
the heat conductive resin layer is a polyimide resin layer containing a heat conductivity material which has a higher heat conductivity than the polyimide resin layer.

12. The semiconductor package according to claim 1, wherein,
in at least any one of the plurality of semiconductor chip units, the semiconductor chip includes an SDRAM device.

13. The semiconductor package according to claim 1, wherein,
in at least any one of the plurality of semiconductor chip units, the semiconductor chip includes an SDRAM device,
in any other semiconductor chip unit, the semiconductor chip includes a flash memory device, and
at least one semiconductor chip unit other than the foregoing two semiconductor chip units is placed between the two semiconductor chip units.

14. The semiconductor package according to claim 1, wherein,
in at least any one of the plurality of semiconductor chip units, the semiconductor chip includes an FCRAM device.

15. The semiconductor package according to claim 1, wherein,
in at least any one of the plurality of semiconductor chip units, the semiconductor chip includes an FCRAM device,
in any other semiconductor chip unit, the semiconductor chip includes a flash memory device, and
at least one semiconductor chip unit other than the foregoing two semiconductor chip units is placed between the two semiconductor chip units.

16. The semiconductor package according to claim 1, wherein,
in at least any one of the plurality of semiconductor chip units, the semiconductor chip includes an FCRAM device,
and the FCRAM device is covered with insulating heat conductive resin layer.

17. The semiconductor package according to claim 1, wherein
a height of the chip cavity and a height of the semiconductor chip are almost same.

18. A semiconductor apparatus, comprising:
the semiconductor package according to claim 1; and
a mount board on which the semiconductor package is mounted and which has a plurality of wiring layers and heat conducting paths for connecting any one of the plurality of wiring layers to the second electrically conductive balls of the semiconductor package, the heat conducting paths being formed in the mount board.

19. The semiconductor apparatus according to claim 18, wherein
the wiring layer connected to the second electrically conductive balls is any one of a power supply wiring layer and a ground wiring layer.

20. The semiconductor package according to claim 1, wherein,
the semiconductor package is an SBM type package in which each of the semiconductor chip units is PTP, and each of the terminals of the semiconductor chin is electrically connected to the wiring by a bump electrode.

21. The semiconductor package according to claim 20, wherein
a height of the chip cavity and a height of the semiconductor chip are almost the same.

* * * * *